(12) United States Patent
Kuroda

(10) Patent No.: US 8,860,149 B2
(45) Date of Patent: Oct. 14, 2014

(54) SEMICONDUCTOR DEVICE MANUFACTURING METHOD AND SEMICONDUCTOR DEVICE

(75) Inventor: Hideaki Kuroda, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 13/544,036

(22) Filed: Jul. 9, 2012

(65) Prior Publication Data

US 2012/0273887 A1    Nov. 1, 2012

Related U.S. Application Data

(62) Division of application No. 12/629,150, filed on Dec. 2, 2009, now Pat. No. 8,227,317.

(30) Foreign Application Priority Data

Dec. 4, 2008  (JP) ................................. 2008-309660

(51) Int. Cl.
| | |
|---|---|
| *H01L 27/088* | (2006.01) |
| *H01L 21/66* | (2006.01) |
| *H01L 27/105* | (2006.01) |
| *H01L 27/12* | (2006.01) |
| *H01L 21/84* | (2006.01) |
| *H01L 27/11* | (2006.01) |
| *H01L 29/78* | (2006.01) |

(52) U.S. Cl.
CPC ............ *H01L 27/105* (2013.01); *H01L 27/1116* (2013.01); *H01L 22/20* (2013.01); *H01L 27/11* (2013.01); *H01L 29/78* (2013.01); *H01L 22/14* (2013.01); *H01L 27/1203* (2013.01); *H01L 27/1104* (2013.01); *H01L 21/84* (2013.01)
USPC ............ 257/401; 257/392; 438/194; 438/289

(58) Field of Classification Search
CPC ........................ H01L 21/845; H01L 29/66537
USPC ............................ 438/194, 289; 257/392, 401
See application file for complete search history.

(56) References Cited

U.S. PATENT DOCUMENTS

| | | |
|---|---|---|
| 6,274,439 B1 | 8/2001 | Ito |
| 2010/0035393 A1 | 2/2010 | Aitken et al. |
| 2010/0148261 A1* | 6/2010 | Fukushima et al. .......... 257/349 |

OTHER PUBLICATIONS

Zheng, Guo et al.; "FinFET-Based SRAM Design", ISLPED 2005, Aug. 8-10, 2005, San Diego, CA , pp. 2-7.

* cited by examiner

*Primary Examiner* — Daniel Whalen
(74) *Attorney, Agent, or Firm* — Wolf, Greenfield & Sacks, P.C.

(57) ABSTRACT

A semiconductor device including a transistor formed on a first surface of a silicon layer; a first insulating film formed on the first surface of said silicon layer and covering said transistor; a wiring section formed in the first insulating film and electrically connected to the transistor; a supporting substrate formed on a surface of the first insulating film with a second insulating film interposed between the supporting substrate and the first insulating film; and an adjusting insulating film for adjusting a threshold voltage of said transistor, the adjusting insulating film being formed on a second surface of said silicon layer opposing the first surface of said silicon layer. Some embodiments may include a probing electrode electrically connected to the transistor and an opening in the silicon layer for exposing the probing electrode.

2 Claims, 10 Drawing Sheets

STATIC NOISE MARGIN OF SRAM

CIRCUIT DIAGRAM OF SIX-TRANSISTOR SRAM CELL

PRIOR ART

FIN TYPE TRANSISTOR

SOI TRANSISTOR WITH THIN SILICON FILM

PRIOR ART

SEMICONDUCTOR DEVICE MANUFACTURING METHOD AND SEMICONDUCTOR DEVICE

RELATED APPLICATIONS

This application claims the benefit as a divisional application under 35 U.S.C. §120 of U.S. patent application Ser. No. 12/629,150 filed Dec. 2, 2009 and entitled "Semiconductor Device Manufacturing Method and Semiconductor Device," which claims the benefit of Japanese Patent Application No. JP 2008-309660 filed Dec. 4, 2008, the entire contents of both of which are incorporated herein by reference.

BACKGROUND OF THE INVENTION

1. Field of the Invention

The present invention relates to a semiconductor device manufacturing method and a semiconductor device.

2. Description of the Related Art

A CPU (Central Processing Unit) and a logic device including a CPU core are composed of a logic circuit section formed mainly by various logic gates and a memory circuit section such as a shift register, a cache memory and the like. This memory circuit section is formed by an SRAM (Static Random Access Memory), for example.

The performance of a logic gate or an SRAM is determined by the performance of a MOS (Metal Oxide Semiconductor) transistor forming the logic gate or the SRAM.

The performance of an MOS transistor is given by the following Equation (1) expressing a drain-to-source current and Equation (2) expressing variation σVt in threshold voltage (see "Fundamentals of Modern VLSI Devices" by Taur and Ning, p. 279).

$$Ids = \beta(Vgs - Vt)^2/2 \quad (1)$$

$$\sigma Vt = q\sqrt{(Na \cdot Wdm0/(3LW))}/Cox \quad (2)$$

In the above Equation (1) and Equation (2), $\beta = \mu \cdot W/L$, where $\mu$ is mobility, L is the gate length of the transistor, and W is the gate width of the transistor, Na is a channel impurity concentration, Wdm0 is the width of a channel depletion layer, and Cox is a gate capacitance.

Generally, the threshold voltage Vt cannot be set at about 0.2 V or lower in a large-scale device due to limitation of a leakage current. Therefore, when Vgs becomes lower than 1.0 V and transistor size (L·W) is reduced according to a scaling law, variation in Ids (performance) is sharply increased.

Accordingly, a provision is made by setting a large operation margin reflecting the increased variation in device design.

There is a static noise margin (hereinafter referred to as an SNM) shown in FIG. 9 as an index indicating the operation margin of an SRAM cell.

In addition, as shown in FIG. 10, the SNM of an SRAM cell formed by six transistors and a variation σSNM in SNM are determined by four transistors MnL, MnR, MpL, and MpR. The transistors MnL and MnR are N-channel transistors, and the transistors MpL and MpR are P-channel transistors. That is, the variation σSNM is expressed by the following Equation (3).

$$\rho SNM = \sigma Vth\sqrt{\{(\partial SNMnR/\partial VtnR)^2 + (\partial SNMnL/\partial VtnL)^2 + (\partial SNMpR/\partial VtpR)^2 + (\partial SNMpL/\partial VtpL)^2\}} \quad (3)$$

In Equation (3), each term of the square root indicates sensitivity of the SNM to Vt variation of each of the four transistors (see ITRS, PIDS WG reports in 2004, for example). Incidentally, the SNMs of the four transistors MnL, MnR, MpL, and MpR are set as SNMnL, SNMnR, SNMpL, and SNMpR, respectively. Incidentally, Vt and Vth denote a threshold voltage, and a threshold voltage is described herein as Vt or Vth according to the description of the quoted document.

It is understood that when σVth is increased by scaling, σSNM is increased, SNM is reduced, and the percent defective of the SRAM is increased sharply.

Measures against this are the following four items. (a) Voltage is not lowered (Vdd, in particular, is not lowered). (b) The thickness of a gate oxide film is reduced (Cox is increased, and thus σVth is reduced). (c) A fully depleted transistor is employed as SRAM transistor (Na is reduced). (d) A redundant array is prepared for a defective SRAM cell, and a yield is ensured by changing to the redundant array.

The (a) item lowers only the voltages of a word line WL and a bit line BL without lowering Vdd, as shown in FIG. 10, and thus enables operation with low power consumption without reducing SNM. The (b) item uses the following thin film formed by a metal-organic chemical vapor deposition (MOCVD) method or an atomic layer deposition (ALD) method as a gate insulating film. A hafnium oxide ($HfO_2$), a hafnium silicide oxynitride (HfSiON), a zirconium oxide ($ZrO_2$), or a zirconium silicide oxynitride (ZrSiON) is used. A titanium nitride (TiN), a tantalum carbide (TaC), tungsten (W) or the like is used as gate electrode. Such methods are proposed. Further, as the (c) item, use of a FinFET type transistor as shown in FIG. 11A or a fully depleted SOI (silicon-on-insulator) transistor having a thin Si layer as shown in FIG. 11B as SRAM transistor is proposed.

As scaling advances, a total number of impurities included in the channel of the transistor is reduced, and variation in threshold voltage due to impurity variation is inevitably increased.

However, in a logic circuit, setting a wide operation margin in consideration of the variation causes a decrease in operating speed, and increasing the power supply voltage Vdd to compensate for the decrease in operating speed invites an increase in power consumption.

In addition, an increase in variation in threshold voltage as described above proportionally increases the SNM variation of the SRAM, and also increases the percent defective of the SRAM. Thus, when this is remedied by a redundant cell and a redundant circuit, the ratio of a redundant array is increased with scaling, and the area of the SRAM as a whole is increased. In addition, scaling only size and not lowering power supply voltage invites an increase in electric field, an increase in leakage current, and an increase in power consumption. Further, reducing the thickness of a gate oxide film using a high dielectric constant (High-k) film and a metallic gate theoretically reduces variation in SNM and enables lower voltage, but eventually invites an increase in SNM variation because Na is increased with scaling.

On the other hand, a fully depleted transistor makes it possible to make Na extremely low, and has a potential for greatly decreasing threshold voltage and SNM variation. However, the FinFET has a vertical transistor structure, so that minute gate electrode processing, ion implantation, diffusion layer formation, side wall spacer formation, and salicide formation are difficult. There is another problem of a high contact resistance because a contact is connected only at a thin Si terminal. Further, a thin SOI transistor (UTSOI) has a high parasitic resistance, and is increased in threshold voltage due to variation in silicon film thickness.

SUMMARY OF THE INVENTION

A problem to be solved is that as scaling advances, a total number of impurities included in the channel of the transistor is reduced and variation in threshold voltage due to impurity variation is increased.

The present invention makes it possible to reduce the variation in threshold voltage by adjusting the threshold voltage of a transistor varied greatly in threshold voltage.

According to an embodiment of the present invention, there is provided a semiconductor device manufacturing method (first manufacturing method) including the steps of: forming a transistor on a surface side of a silicon layer of a silicon-on-insulator substrate, the silicon-on-insulator substrate being formed by laminating a substrate, an insulating layer, and the silicon layer; forming a first insulating film covering the transistor and a wiring section including a part electrically connected to the transistor on the silicon-on-insulator substrate; measuring a threshold voltage of the transistor through the wiring section; forming a supporting substrate on a surface of the first insulating film with a second insulating film interposed between the supporting substrate and the first insulating film; removing at least a part of the substrate and the insulating layer on a back side of the silicon-on-insulator substrate; and adjusting the threshold voltage of the transistor on a basis of the measured threshold voltage.

The first manufacturing method according to the embodiment of the present invention measures the threshold voltage of each individual transistor, and adjusts the threshold voltage of a transistor outside a threshold voltage reference. Therefore variation in threshold voltage is reduced.

According to another embodiment of the present invention, there is provided a semiconductor device manufacturing method (second manufacturing method) including the successive steps of: forming a transistor on a surface side of a silicon layer of a silicon-on-insulator substrate, the silicon-on-insulator substrate being formed by laminating a substrate, an insulating layer, and the silicon layer; forming a first insulating film covering the transistor and a wiring section on the silicon-on-insulator substrate, and forming a probing electrode connected to the transistor when forming the wiring section; forming a supporting substrate on a surface of the first insulating film with a second insulating film interposed between the supporting substrate and the first insulating film; removing at least a part of the substrate and the insulating layer on a back side of the silicon-on-insulator substrate; forming an opening for exposing the probing electrode in the silicon layer and the first insulating film from a back side of the silicon layer; measuring a threshold voltage of the transistor through the probing electrode; and adjusting the threshold voltage of the transistor on a basis of the measured threshold voltage.

The second manufacturing method according to the embodiment of the present invention measures the threshold voltage of each individual transistor, and adjusts the threshold voltage of a transistor outside a threshold voltage reference. Therefore variation in threshold voltage is reduced.

According to a further embodiment of the present invention, there is provided a semiconductor device (first semiconductor device) including: a transistor formed on a surface side of a silicon layer; a first insulating film formed on a surface of the silicon layer and covering the transistor; a wiring section formed in the first insulating film and electrically connected to the transistor; a supporting substrate formed on a surface of the first insulating film with a second insulating film interposed between the supporting substrate and the first insulating film; and an adjusting insulating film for adjusting a threshold voltage of the transistor, the adjusting insulating film being formed on a back side of the silicon layer.

The first semiconductor device according to the embodiment of the present invention has the adjusting insulating film for adjusting the threshold voltage of the transistor on the back side of the silicon layer. Thereby the threshold voltage of the transistor is adjusted to a desired value.

According to yet another embodiment of the present invention, there is provided a semiconductor device (second semiconductor device) including: a transistor formed on a surface side of a silicon layer; a first insulating film formed on a surface of the silicon layer and covering the transistor; a wiring section formed in the first insulating film and electrically connected to the transistor; a probing electrode electrically connected to the transistor; a supporting substrate formed on a surface of the first insulating film with a second insulating film interposed between the supporting substrate and the first insulating film; and an opening for exposing the probing electrode, the opening being formed in the silicon layer and the first insulating film from a back side of the silicon layer.

The second semiconductor device according to the embodiment of the present invention has the opening for exposing the probing electrode connected to the transistor. Thereby the threshold voltage of the transistor can be measured easily from the opening. As a result, analytic evaluation of the transistor can be performed, and a circuit block or a transistor causing a lack of speed of a logic circuit or a lack of a voltage margin is detected. Then, the threshold voltage of the detected transistor can be corrected after completion of a wafer process or while the analytic evaluation is performed.

The first semiconductor device manufacturing method and the second semiconductor device manufacturing method according to the embodiments of the present invention can adjust the threshold voltage of the transistor outside a threshold voltage reference. Therefore variation in threshold voltage can be reduced. Thus, the first semiconductor device manufacturing method and the second semiconductor device manufacturing method have advantages of enabling higher speed, lower-voltage operation, and lower power consumption of the transistor circuit.

The first semiconductor device and the second semiconductor device according to the embodiments of the present invention can adjust the threshold voltage of the transistor outside a threshold voltage reference. Therefore variation in threshold voltage can be reduced. Thus, the first semiconductor device and the second semiconductor device have advantages of enabling higher speed, lower-voltage operation, and lower power consumption of the transistor circuit.

DETAILED DESCRIPTION OF THE PREFERRED EMBODIMENTS

<1. First Embodiment>
[First Example of Method of Manufacturing Semiconductor Device]

A first example of a method of manufacturing a semiconductor device according to a first embodiment of the present invention will be described with reference to manufacturing process sectional views of FIGS. 1 to 4. FIGS. 1 to 4 show N-channel transistors of a logic circuit section and an SRAM cell section as a memory circuit section as an example.
[Formation of Transistor]

Figure 1:
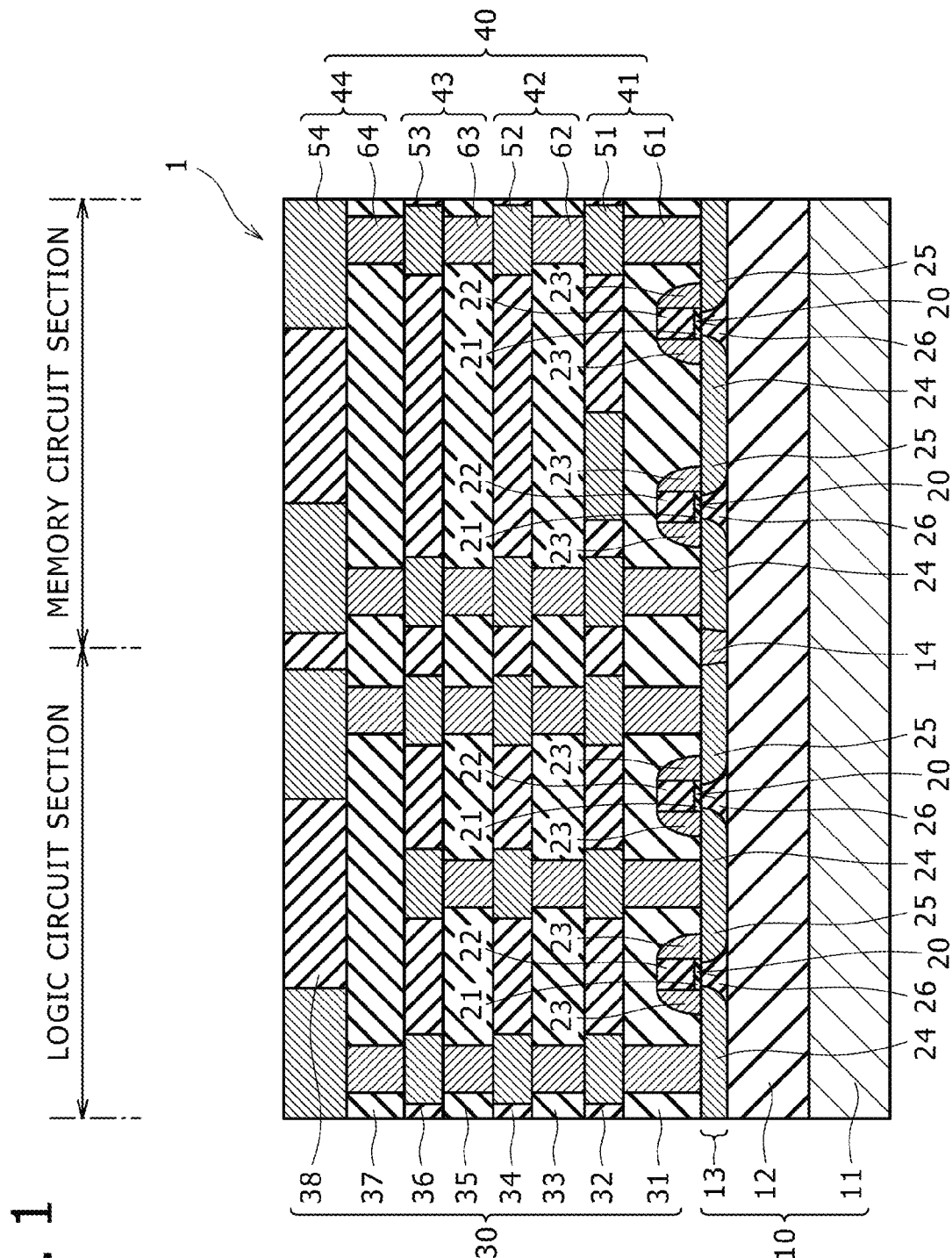
FIG. 1 is a manufacturing process sectional view of a first example of a method of manufacturing a semiconductor device according to an embodiment of the present invention.

As shown in FIG. 1, an SOI substrate 10 formed by laminating a substrate 11, an insulating layer 12, and a silicon layer 13 is prepared. The substrate 11 is formed by for example a silicon substrate as a semiconductor substrate having conductivity, for example. The insulating layer 12 is formed by a silicon oxide film, for example.

First, an element isolation region 14 for isolating the logic circuit section, the memory circuit section and the like from each other is formed in the silicon layer 13. The element isolation region 14 is for example formed by making a groove in the silicon layer 13 and filling in the groove with an insulating film. The insulating film includes for example a silicon oxide (for example $SiO_2$) film, a silicon nitride (for example SiN) film, and a silicon oxynitride (for example SiON) film. That is, the element isolation region 14 is formed of a so-called STI (Shallow Trench Isolation) structure.

Next, a transistor 20 is formed on the surface side of the silicon layer 13.

First, a gate insulating film 21 is formed on the surface of the silicon layer 13. The gate insulating film 21 is formed by a so-called high dielectric constant (High-k) film such for example as a hafnium oxide (for example $HfO_2$), a hafnium silicide oxynitride, a zirconium oxide (for example $ZrO_2$), or a zirconium silicide oxynitride. Alternatively, the gate insulating film 21 is formed by a composite film of a thermally oxidized nitride film and the high dielectric constant film. The high dielectric constant film is for example formed by MOCVD (metal-organic chemical vapor deposition) and an atomic layer deposition (ALD) method. The thermally oxidized nitride film is formed by thermal oxidation, plasma oxidation, and a plasma nitridation method. Further, a gate electrode 22 is formed on the gate insulating film 21. This gate electrode 22 is formed by for example a titanium nitride, a tantalum carbide, tungsten, or polysilicon.

Next, side wall spacers 23 are formed on the side walls of the gate electrode 22.

Next, source-drain regions 24 and 25 are formed in the silicon layer 13 with the gate electrode 22, the side wall spacers 23, and the element isolation region 14 as a mask. At this time, an LDD (Lightly Doped Drain) layer (not shown) is formed in the silicon layer 13 before the side wall spacers 23 are formed, and thereafter the side wall spacers 23 are formed. Then, the source-drain regions 24 and 25 are formed. The source-drain regions 24 and 25 may thus have an LDD structure. Hence, the silicon layer 13 directly under the gate electrode 22 forms a channel section 26.

The transistor 20 is thus formed.

Next, a first insulating film 30 and a wiring section 40 including wiring electrically connected to the transistor 20 are formed on the SOI substrate 10. In the constitution shown in the drawing, wiring sections 41 to 44 of four layers (pieces of wiring 51 to 54 and plugs 61 to 64) and first insulating films 31 to 38 of eight layers are formed. The number of layers of the wiring section 40 is selected and determined as appropriate. Thus, the number of layers of the wiring section 40 can be five or more. Generally, the wiring section 40 is formed by laminating about seven layers.

At this time, the first insulating film 31 in the lowermost layer is of a thickness of a few hundred nm, for example, and formed in a state of completely covering the gate electrode 22. The surface of the first insulating film 31 is desirably planarized by chemical mechanical polishing (CMP), for example. In addition, the surface of the first insulating film 38 in the uppermost layer is planarized by chemical mechanical polishing (CMP), for example, to expose the wiring 54 in the uppermost layer.

Specifically, the wiring section 40 is formed as follows.

For example, after the first insulating film 31 is formed, a connecting hole reaching a predetermined position (for example a source-drain region or the gate electrode) of the transistor 20 is formed in the first insulating film 31, and the connecting hole is filled in with a conductive material on the inner surface of the connecting hole with an adhesion layer and a barrier layer interposed between the inner surface of the connecting hole and the conductive material, whereby the plug 61 is formed. For example, titanium is used for the adhesion layer, a titanium nitride is used for the barrier layer, and tungsten is used for the conductive material. Alternatively, tantalum is used for the adhesion layer, a tantalum nitride is used for the barrier layer, and copper is used for the conductive material. Incidentally, excesses of the adhesion layer, the barrier layer, and the conductive material formed on the first insulating film 31 are removed by chemical mechanical polishing, for example.

Next, the first insulating film 32 of the second layer is formed by for example a silicon carbide nitride on the first insulating film 31. A wiring groove is formed in the first insulating film 32 of the second layer, and for example the wiring groove is filled in with a conductive material on the inner surface of the wiring groove with an adhesion layer and a barrier layer interposed between the inner surface of the wiring groove and the conductive material, whereby wiring 51 connected to the plug 61 is formed. For example, titanium or tantalum is used for the adhesion layer, a titanium nitride or a tantalum nitride is used for the barrier layer, and copper is used for the conductive material. Incidentally, excesses of the adhesion layer, the barrier layer, and the conductive material formed on the first insulating film 32 are removed by chemical mechanical polishing, for example.

Next, the first insulating film 33 of the third layer is formed on the first insulating film 32 of the second layer. The first insulating film 33 of the third layer is formed by for example a silicon oxide carbide including hydrogen (H) (SiOCH), a silicon oxide carbide (SiOC), or a porous silicon oxide carbide.

Then, as in the above, a connecting hole is formed in the first insulating film 33, and for example the connecting hole is filled in with a conductive material on the inner surface of the connecting hole with an adhesion layer and a barrier layer interposed between the inner surface of the connecting hole and the conductive material, whereby a plug 62 connected to the wiring 51 is formed. For example, titanium or tantalum is used for the adhesion layer, a titanium nitride or a tantalum nitride is used for the barrier layer, and copper is used for the conductive material. Incidentally, excesses of the adhesion layer, the barrier layer, and the conductive material formed on the first insulating film 33 are removed by chemical mechanical polishing, for example.

Thereafter, as in the above, a connecting hole is formed in the first insulating film 30 of the (n−1)th layer and a plug is formed, and a wiring groove is formed in the first insulating film 30 of the nth layer and wiring is formed. In this case, n is a total number of layers of the first insulating film 30, and n=8 in FIG. 1.

The plugs and the wiring can also be formed simultaneously by a so-called dual damascene process.

The semiconductor device 1 is thus formed.

[Measurement of Threshold Voltage]

Figure 2:
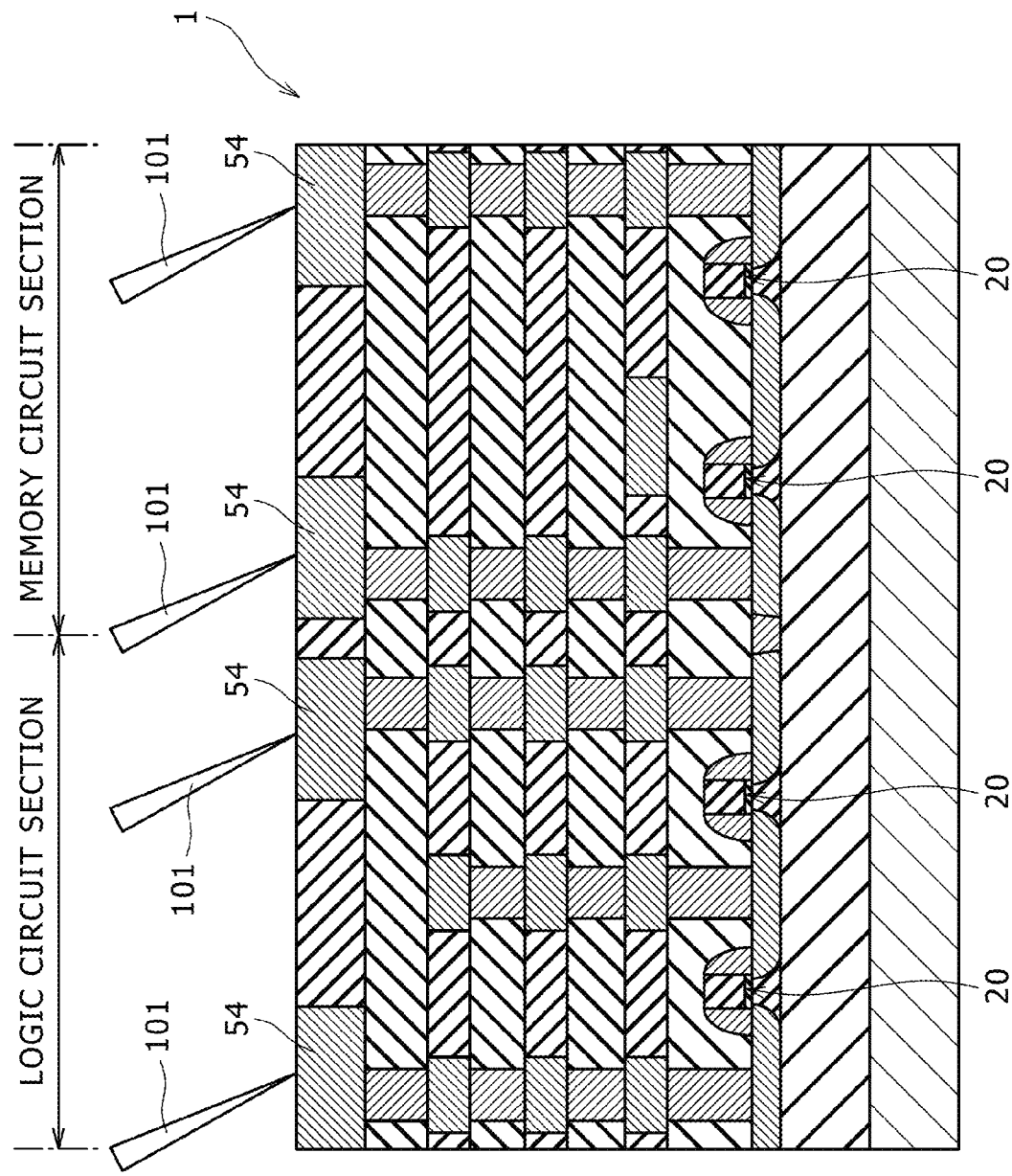
FIG. 2 is a manufacturing process sectional view of the first example of the method of manufacturing the semiconductor device according to an embodiment of the present invention.
Figure 9:
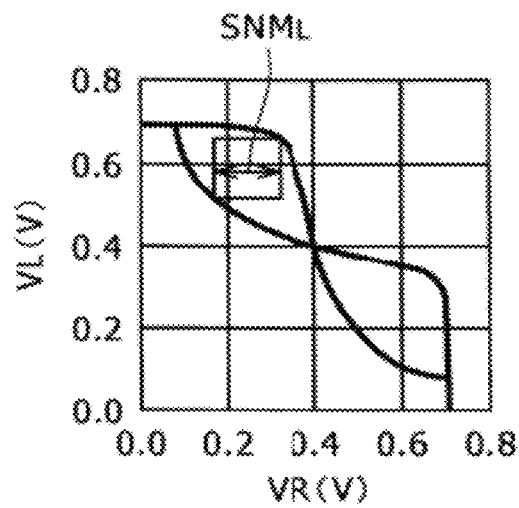
FIG. 9 is a diagram showing an example of a static noise margin.
Figure 10:
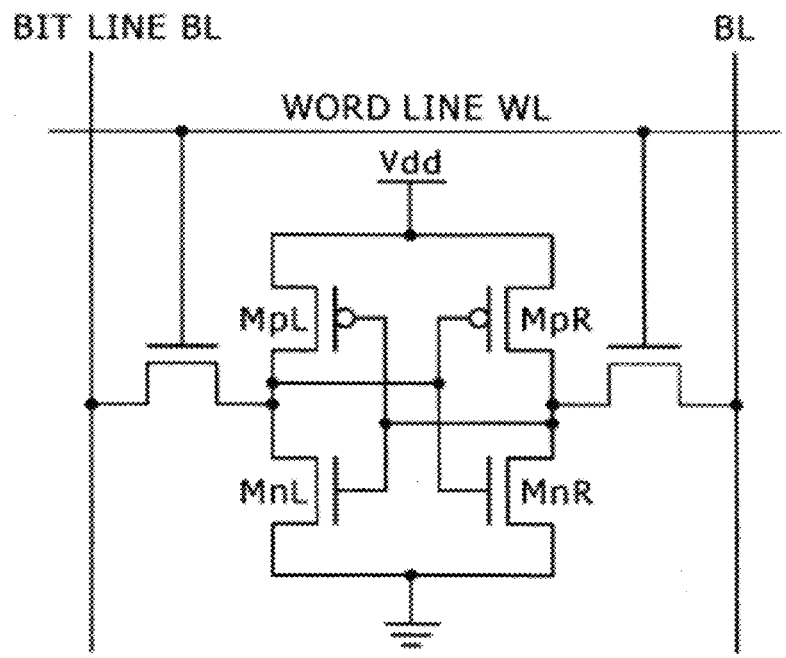
FIG. 10 is a circuit diagram showing an example of an SRAM of a typical six-transistor configuration.
Figure 11A:
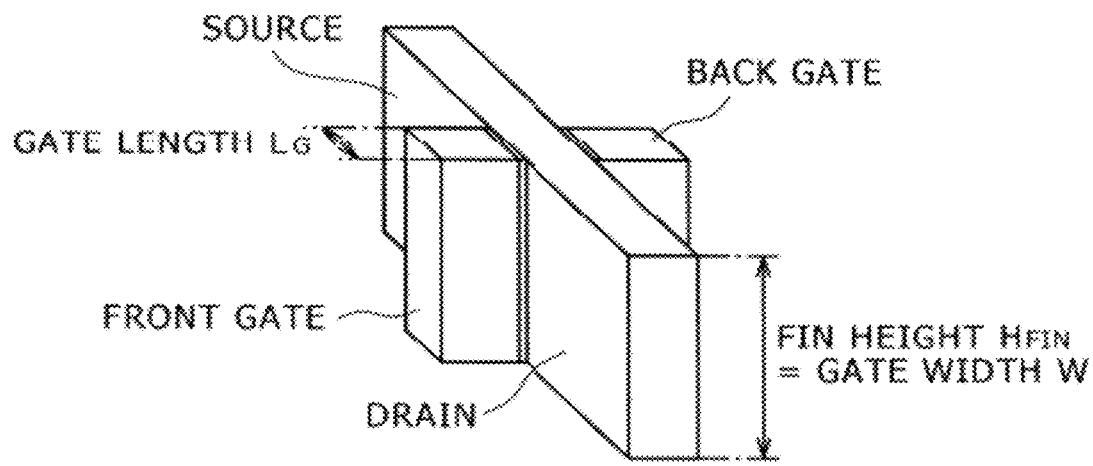
FIGS. 11A and 11B are a plan layout view and a perspective view of an example of related art transistors, respectively.
Figure 11B:
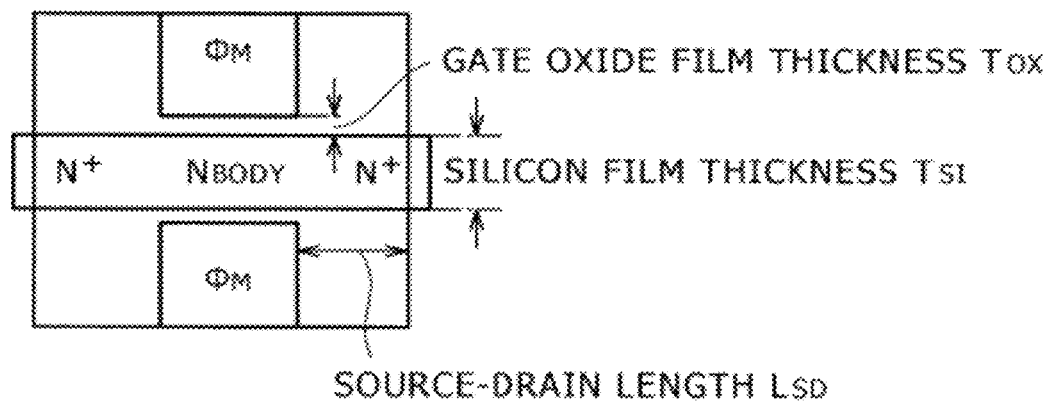

Next, as shown in FIG. 2, a performance verification test is performed on the logic circuit section and the memory circuit section (SRAM section) through the wiring 54 of the uppermost layer. For example, as for the logic circuit section, a test pattern is generated through a BIST (Built In Self Test) circuit provided in the logic circuit section, and a circuit block or a transistor of low performance which circuit block or transistor limits the performance of the semiconductor device 1 is detected. In addition, also for the SRAM section, a butterfly curve indicating the SNM of each SRAM cell (see FIG. 9 described above) is measured through a BIST circuit provided within an LSI (Large Scale Integration), an SRAM cell of a low SNM is detected, and a transistor causing the low SNM is identified.

Specifically, for example, a probe 101 for the measurement is brought into contact with the wiring 54 of the uppermost layer to measure the threshold voltage of the transistor 20. The measurement is desirably performed on all the transistors 20.

[Formation of Supporting Substrate]

Figure 3:
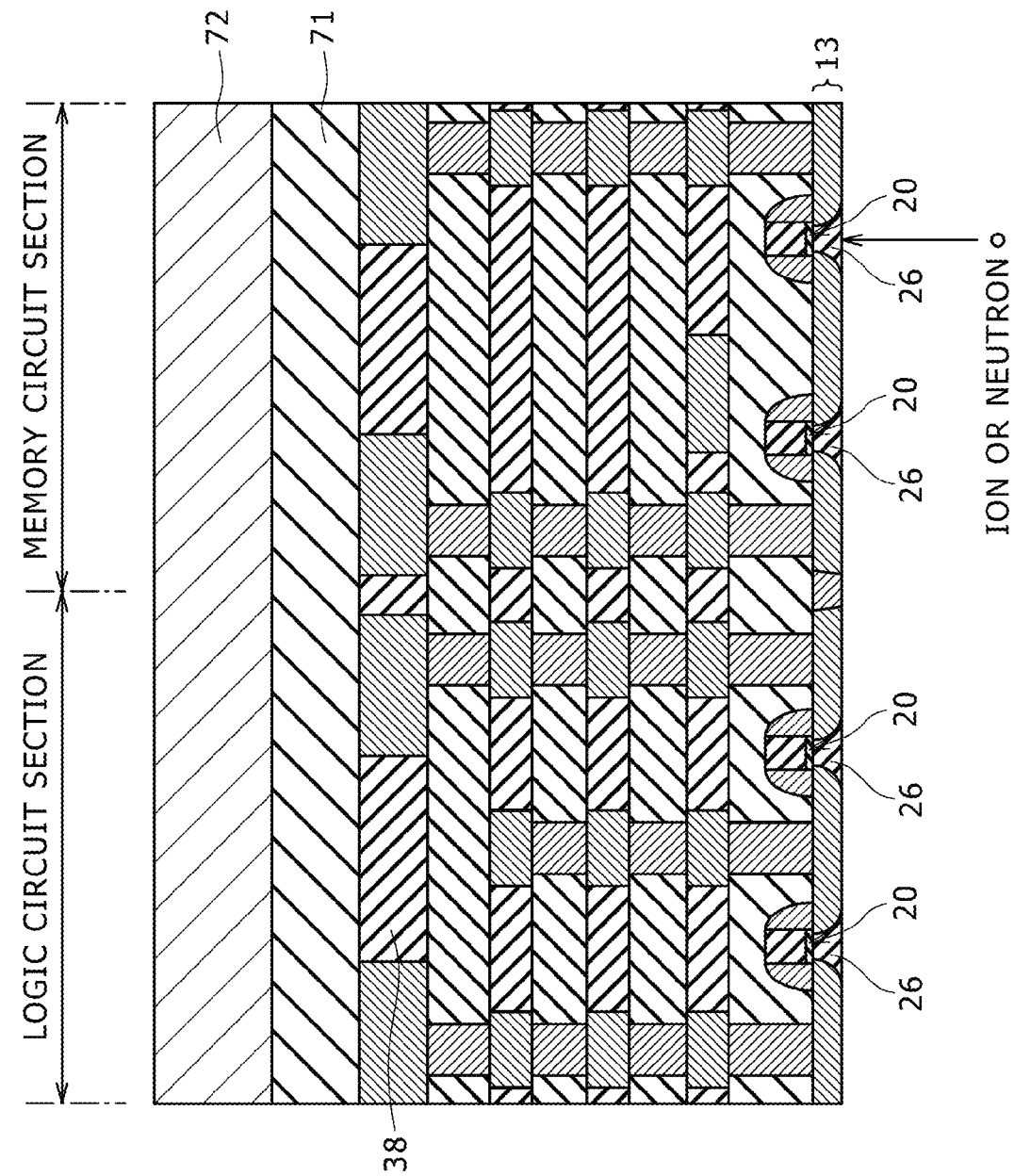
FIG. 3 is a manufacturing process sectional view of the first example of the method of manufacturing the semiconductor device according to an embodiment of the present invention.

After the measurement is finished, as shown in FIG. 3, a supporting substrate 72 is formed on the surface of the first insulating film 30 (38) formed in the uppermost layer with a second insulating film 71 interposed between the supporting substrate 72 and the first insulating film 30. The second insulating film 71 is formed by a silicon oxide ($SiO_2$) film, for example. A silicon substrate, a resin substrate, or a glass substrate, for example, can be used as the supporting substrate 72.

Next, at least a part of the substrate 11 (see FIG. 1 described above) and the insulating layer 12 (see FIG. 1 described above) on the back side of the SOI substrate 10 is removed to expose the back surface of the silicon layer 13. In this case, the substrate 11 and the insulating layer 12 are removed over the entire surface. Alternatively, the insulating layer 12 may be left as it is, or left thinly over the entire surface. Alternatively, after the insulating layer 12 is removed completely, an oxide film, for example a silicon oxide film may be formed over the entire surface of the silicon layer 13.

[Adjustment of Threshold Voltage]

Thereafter a process of adjusting the threshold voltage of the transistor 20 outside a threshold voltage reference on the basis of the measured threshold voltage is performed.

[Adjustment of Threshold Voltage by Ion Implantation]

The process of adjusting the threshold voltage of the transistor 20 outside the threshold voltage reference is performed by ion implantation of a group 13 element or a group 15 element into the channel section 26 of the transistor 20 to be adjusted in threshold voltage from the back side of the silicon layer 13. While the group 13 element includes boron (B), aluminum (Al), gallium (Ga), indium (In) and the like, the group 13 element is more preferably boron (B). While the group 15 element includes nitrogen (N), phosphorus (P), arsenic (As), antimony (Sb) and the like, the group 15 element is more preferably phosphorus (P). Suppose that the threshold voltage reference is for example 0.3 V or lower.

The threshold voltage of the transistor 20 is adjusted by ion implantation of the group 13 element into the channel section 26 of the transistor 20. For example, when the transistor 20 is an NFET, the threshold voltage (but the absolute value of the threshold voltage) is raised. When the transistor 20 is a PFET, the threshold voltage (but the absolute value of the threshold voltage) is lowered.

Thus, in the case of a FET having a high threshold voltage, adjustment is made so as to decrease the threshold voltage. In the case of a FET having too low a threshold voltage, adjustment is made so as to increase the threshold voltage.

The above-described ion implantation can adjust the threshold voltage by implanting one or a few ions. A technique of performing ion implantation of ions one by one is referred to as a single ion implantation method.

When the ion implantation is performed, a resist mask (not shown) having an opening made in the part of the channel section 26 into which the ion implantation is performed may be formed on the back surface of the silicon layer 13. Thus forming the resist mask enables ion implantation of the group 13 element or the group 15 element into only the channel section 26 of the desired transistor 20. The resist mask is removed after the ion implantation.

[Adjustment of Threshold Voltage by Neutron Implantation]

The process of adjusting the threshold voltage of the transistor 20 outside the threshold voltage reference may be performed by implanting a neutron into the channel section 26 of the transistor 20. By implanting a neutron into the channel section 26 of the transistor 20, the impurity distribution of the channel section 26 is modulated, and thus the threshold voltage of the transistor 20 is adjusted. That is, by implanting a neutron into the silicon layer 13, silicon (Si) in the silicon layer 13 is changed to phosphorus (P), and thus phosphorus (P) is increased in effect. Therefore, when the transistor 20 is an NFET, the threshold voltage (but the absolute value of the threshold voltage) is lowered. When the transistor 20 is a PFET, the threshold voltage (but the absolute value of the threshold voltage) is raised.

Thus, in the case of a FET having a high threshold voltage, adjustment is made so as to decrease the threshold voltage. In the case of a FET having too low a threshold voltage, adjustment is made so as to increase the threshold voltage.

Incidentally, when it is difficult to make the range of the neutron implantation shallow, the implantation may be performed before the substrate 11 and the insulating layer 12 are removed, or performed after the substrate 11 is removed, or performed in a process of the insulating layer 12 being removed. In addition, because neutrons are implanted over the entire surface, it is desirable to look at the threshold voltages of all the transistors and implant neutrons so as to lower the average of the threshold voltages of all the transistors.

[Adjustment of Threshold Voltage by Laser Light Irradiation]

The process of adjusting the threshold voltage of the transistor 20 outside the threshold voltage reference may also be performed by for example spot-like irradiation of the channel section 26 of the transistor 20 with laser light from the back side of the silicon layer 13. By irradiating the channel section 26 of the transistor 20 with laser light, an impurity in the channel section 26 is activated, an impurity distribution is modulated, and thus the threshold voltage of the transistor 20 is adjusted. For example, in both cases where the transistor 20 is an NFET and where the transistor 20 is a PFET, the threshold voltage (but the absolute value of the threshold voltage) is lowered.

When the laser light irradiation is performed, a light shielding mask (not shown) having an opening made in the part of the channel section 26 to be irradiated with laser light may be formed on the back surface of the silicon layer 13. Thus forming the light shielding mask enables accurate irradiation of only the channel section 26 of the desired transistor 20 with laser light. When the light shielding mask is used, the entire surface may be irradiated with laser light. The light shielding mask is removed after the laser light irradiation.

The light shielding mask may be of any material as long as the light shielding mask blocks laser light and does not contaminate the silicon layer 13. For example, a metallic film such as an aluminum film and a tungsten film formed on the back surface of the silicon layer 13 via a silicon oxide film can be used.

As described above, with the first manufacturing method, it is possible to measure the threshold voltage of each transistor 20, and adjust the threshold voltage of a transistor 20 outside the threshold voltage reference. Thus, variation in the threshold voltage of the transistor 20 is reduced.

[Adjustment of Threshold Voltage by Circuit Block]

It is generally difficult to identify a transistor that limits the performance of the logic circuit section among the large number of transistors forming the logic circuit section. It is, however, possible to identify a circuit block that limits the performance among circuit blocks (certain transistor groups) forming the logic circuit section. Accordingly, the threshold voltage of transistors in each circuit block is adjusted, whereby the performance of the semiconductor device as a whole can be improved.

Figure 4:
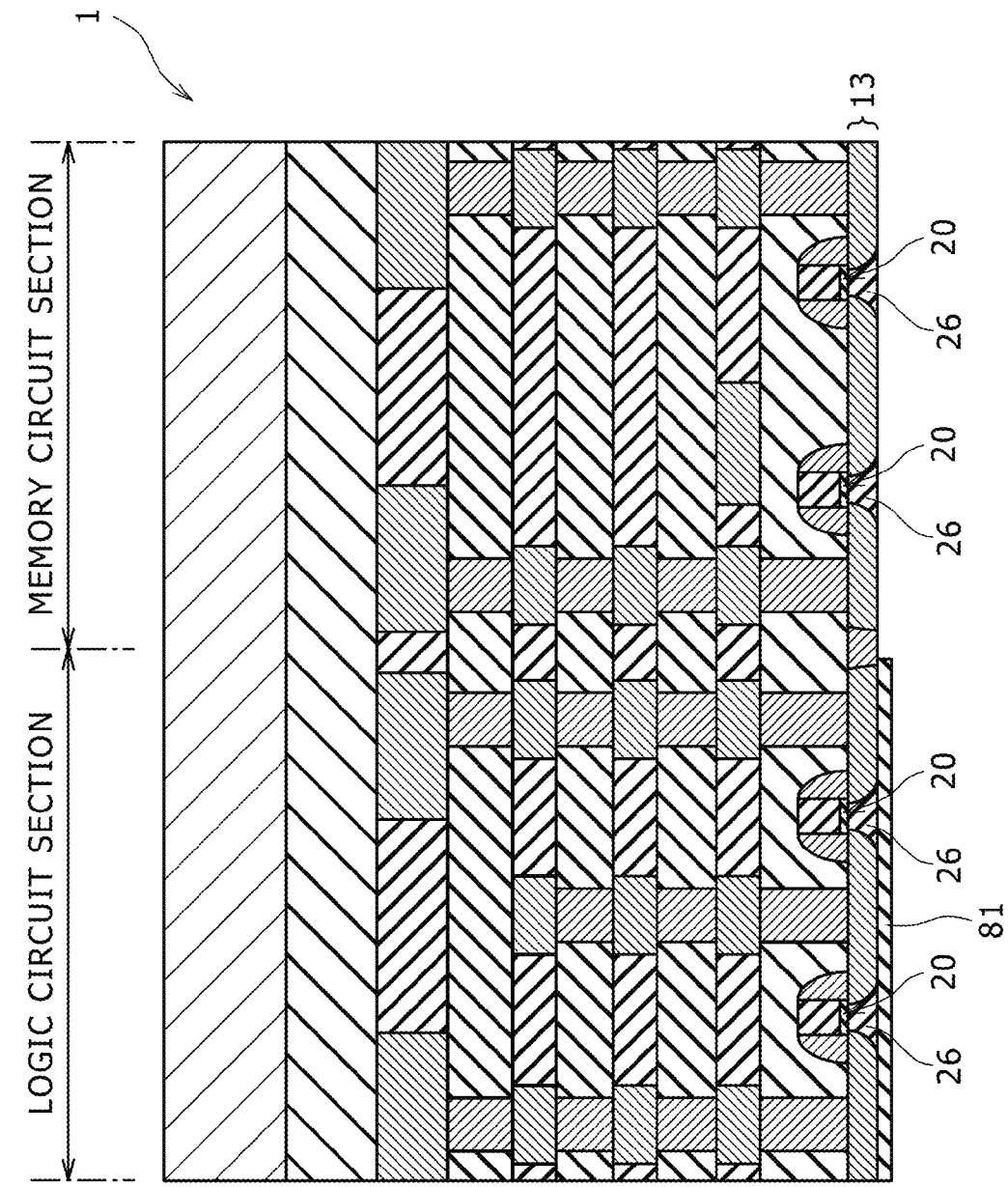
FIG. 4 is a manufacturing process sectional view of the first example of the method of manufacturing the semiconductor device according to an embodiment of the present invention.

For example, as shown in FIG. 4, the process of adjusting the threshold voltage of the transistor 20 forms an adjusting insulating film 81 for adjusting the threshold value of the transistor 20 on the back side of the silicon layer 13 at a position where the transistor 20 to be adjusted in threshold voltage is formed.

Concrete description will be made in the following.

For example, the logic circuit section and the memory circuit section forming the semiconductor device 1 are formed as described with reference to FIG. 1. Of the circuit sections, the logic circuit section is formed by a plurality of circuit blocks, and each circuit block has a plurality of transistors.

First, in the process of measuring the threshold voltage of the transistor, the threshold voltage of the transistor 20 is measured to detect a circuit block limiting the performance of the semiconductor device 1. Then, on the basis of the measured threshold voltage, the adjusting insulating film 81 is formed in the detected circuit block.

[Adjustment of Threshold Voltage by Insulating Film including Impurity]

The adjusting insulating film 81 is formed by a silicon oxide film including a group 13 element or a group 15 element. While the group 13 element includes boron (B), aluminum (Al), gallium (Ga), indium (In) and the like, the group 13 element is more preferably boron (B). While the group 15 element includes nitrogen (N), phosphorus (P), arsenic (As), antimony (Sb) and the like, the group 15 element is more preferably phosphorus (P).

The threshold voltage of the transistor 20 is adjusted by diffusing the group 13 element in the silicon oxide film including the group 13 element into the channel section 26 of the transistor 20. For example, when the transistor 20 is an NFET, the threshold voltage (but the absolute value of the threshold voltage) is raised. When the transistor 20 is a PFET, the threshold voltage (but the absolute value of the threshold voltage) is lowered.

The threshold voltage of the transistor 20 is adjusted by diffusing the group 15 element in the silicon oxide film including the group 15 element into the channel section 26 of the transistor 20. For example, when the transistor 20 is an NFET, the threshold voltage (but the absolute value of the threshold voltage) is lowered. When the transistor 20 is a PFET, the threshold voltage (but the absolute value of the threshold voltage) is raised.

Thus, in the case of a FET having a high threshold voltage, adjustment is made so as to decrease the threshold voltage. In the case of a FET having too low a threshold voltage, adjustment is made so as to increase the threshold voltage.

The process of forming the silicon oxide film including the group 13 element or the group 15 element is performed as follows.

For example, the back surface of the silicon layer 13 where the channel section 26 of the transistor 20 is formed is irradiated with an ion beam, an electron beam, or laser light in a mixed gas of a gas including a group 13 element or a group 15 element in molecules, a silane base gas, and oxygen. Then, a thin film including the group 13 element or the group 15 element is formed on the back surface of the silicon layer 13 where the channel section 26 of the transistor 20 is formed. Local and selective film formation can be performed when an energy beam such as an ion beam, an electron beam, or laser light is used as an assist. For example, a film can be formed on the back surface of the silicon layer 13 where the channel section 26 of one transistor 20 is formed. Alternatively, a film can be formed on the back surface of the silicon layer 13 where a plurality of transistors 20 are formed. In addition, because it suffices to introduce one or a few group 13 elements or group 15 elements into the channel section 26, it suffices for the film thickness of the adjusting insulating film 81 to be that of a layer of a few atoms or a few nm (for example 5 nm).

The gas including the group 13 element in molecules includes for example diborane ($B_2H_6$). Of course, a gas including a group 13 element other than boron (B) can also be used. The gas including the group 15 element in molecules includes for example phosphine ($PH_3$). Of course, a gas including a group 15 element other than phosphorus (P) can also be used. The silane base gas includes monosilane ($SiH_4$), disilane ($Si_2H_6$), trisilane ($Si_3H_8$) and the like.

[Adjustment of Threshold Voltage by Insulating Film having Stress]

The adjusting insulating film 81 is also formed by an insulating film having stress. For example, the adjusting insulating film 81 is formed by a silicon nitride film. That is, the threshold voltage of the transistor 20 is adjusted by applying a stress inherent in the silicon nitride film to the channel section 26 of the transistor 20.

For example, when the transistor 20 is a PFET, and the stress of the silicon nitride film is a compressive stress, the threshold voltage of the PFET can be lowered. When the transistor 20 is an NFET, and the stress of the silicon nitride film is a tensile stress, the threshold voltage of the NFET can be lowered.

The silicon nitride film can be for example made to be a compressive stress film by including carbon in the silicon nitride film, and made to be a tensile stress film by including hydrogen (H) in the silicon nitride film.

Thus, in the case of a FET having a high threshold voltage, adjustment is made so as to decrease the threshold voltage. In the case of a FET having too low a threshold voltage, adjustment is made so as to increase the threshold voltage.

[Adjustment of Threshold Voltage by Insulating Film having Fixed Charge]

The adjusting insulating film 81 is also formed by an insulating film having a fixed charge. For example, as an insulating film having a fixed charge, an insulating film having a negative fixed charge or an insulating film having a positive fixed charge is used properly according to a purpose. The insulating film having the negative fixed charge includes for example a hafnium oxide ($HfO_2$) film. The insulating film having the positive fixed charge includes for example a silicon oxynitride (SiON) film.

In the case of the insulating film having the negative fixed charge, for example the negative fixed charge in the hafnium oxide film gives a charge (electron) to the channel section 26 of the transistor 20, whereby the threshold voltage of the transistor 20 is adjusted. For example, when the transistor 20 is an NFET, the threshold voltage (but the absolute value of the threshold voltage) is raised. When the transistor 20 is a PFET, the threshold voltage (but the absolute value of the threshold voltage) is lowered.

In the case of the insulating film having the positive fixed charge, for example the positive fixed charge in the silicon oxynitride film gives a charge (hole) to the channel section 26 of the transistor 20, whereby the threshold voltage of the transistor is adjusted. For example, when the transistor 20 is a PFET, the threshold voltage (but the absolute value of the threshold voltage) is raised. When the transistor 20 is an NFET, the threshold voltage (but the absolute value of the threshold voltage) is lowered.

Thus, in the case of a FET having a high threshold voltage, adjustment is made so as to decrease the threshold voltage. In the case of a FET having too low a threshold voltage, adjustment is made so as to increase the threshold voltage.

[Adjustment of Threshold Voltage by Ion Implantation]

Threshold value adjustment in each of the circuit blocks can also be performed by ion implantation using a resist mask described above with reference to FIG. 3. It for example suffices to form a resist mask (not shown) having an opening provided over a circuit block to be adjusted in threshold voltage on the back surface of the silicon layer 13, and perform ion implantation similar to that described above.

Specifically, the threshold voltage adjustment is performed by ion implantation of a group 13 element or a group 15 element into the respective channel sections 26 of a group of transistors 20 of the circuit block to be adjusted in threshold voltage from the back side of the silicon layer 13. While the group 13 element includes boron (B), aluminum (Al), gallium (Ga), indium (In) and the like, the group 13 element is more preferably boron (B). While the group 15 element includes nitrogen (N), phosphorus (P), arsenic (As), antimony (Sb) and the like, the group 15 element is more preferably phosphorus (P).

The threshold voltage of the transistor 20 is adjusted by performing ion implantation of the group 13 element into the channel section 26 of the transistor 20. For example, when the transistor 20 is an NFET, the threshold voltage (but the absolute value of the threshold voltage) is raised. When the transistor 20 is a PFET, the threshold voltage (but the absolute value of the threshold voltage) is lowered.

The threshold voltage of the transistor 20 is adjusted by performing ion implantation of the group 15 element into the channel section 26 of the transistor 20. For example, when the transistor 20 is an NFET, the threshold voltage (but the absolute value of the threshold voltage) is lowered. When the transistor 20 is a PFET, the threshold voltage (but the absolute value of the threshold voltage) is raised.

Thus, in identical ion implantation, the threshold voltages of an NFET and a PFET make transitions in opposite directions. Therefore circuit blocks may be set for each group of NFETs or PFETs.

[Adjustment of Threshold Voltage in Each Circuit Block]

When NFETs and PFETs are mixed with each other within a circuit block, the threshold voltages of the transistors are adjusted in a direction of improving the performance of the circuit block within the circuit block. Thus, in some cases, the threshold voltage of a certain transistor may be adjusted in a direction of being raised. However, when the performance of the whole of one circuit block being adjusted is improved, there may be a transistor whose threshold voltage is adjusted in a direction of being raised within the circuit block.

In addition, after the adjusting insulating film 81 is formed, or after the ion implantation, an impurity implanted region may be annealed by being irradiated with laser light.

[Other Examples of Threshold Voltage Adjusting Method]

When the threshold voltage of each individual transistor is adjusted as described above, the address information of a measured transistor and information on a measured threshold voltage are stored in association with each other before the threshold voltage of the transistor is adjusted.

A similar method is used also when the threshold voltages of transistors are adjusted by circuit block. The address information of the transistors of a measured circuit block and information on measured threshold voltages are stored in association with each other.

Then, the address of a transistor to be adjusted in threshold voltage is retrieved on the basis of the address information of the transistor and information on the threshold voltage of the corresponding transistor. Next, the threshold voltage of the transistor is adjusted in correspondence with the information on the threshold voltage of the transistor at the retrieved address.

Evaluation of performance of the transistor or the circuit block and the adjustment of the threshold voltage of the transistor may be performed in a wafer state or a chip state.

The first manufacturing method measures the threshold voltage of each individual transistor 20, and adjusts the threshold voltage of a transistor 20 outside the threshold voltage reference. Therefore variation in the threshold voltage of the transistor 20 is reduced.

Thus, reducing the variation in the threshold voltage provides advantages of higher speed, lower-voltage operation, and lower power consumption of the transistor circuit. That is, higher speed, lower-voltage operation, and reduced power consumption of the logic circuit section can be achieved. In addition, variation in SNM of the memory circuit section, for example an SRAM can be reduced, and improvement in yield and lower-voltage operation and lower power consumption of the SRAM can be achieved.

<2. Second Embodiment>

[Second Example of Method of Manufacturing Semiconductor Device]

Figure 5:
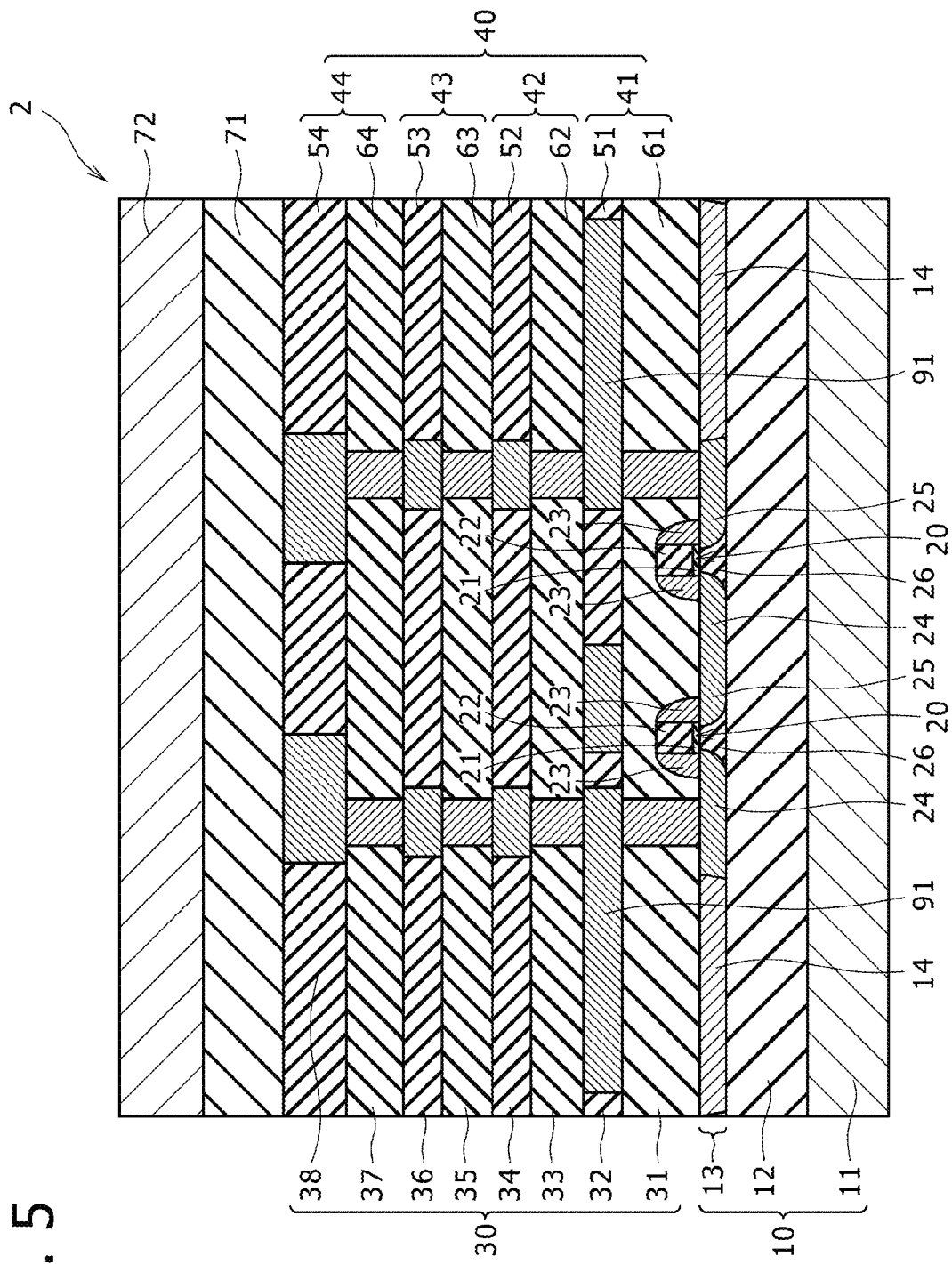
FIG. 5 is a manufacturing process sectional view of the first example of the method of manufacturing the semiconductor device according to an embodiment of the present invention.
Figure 6:
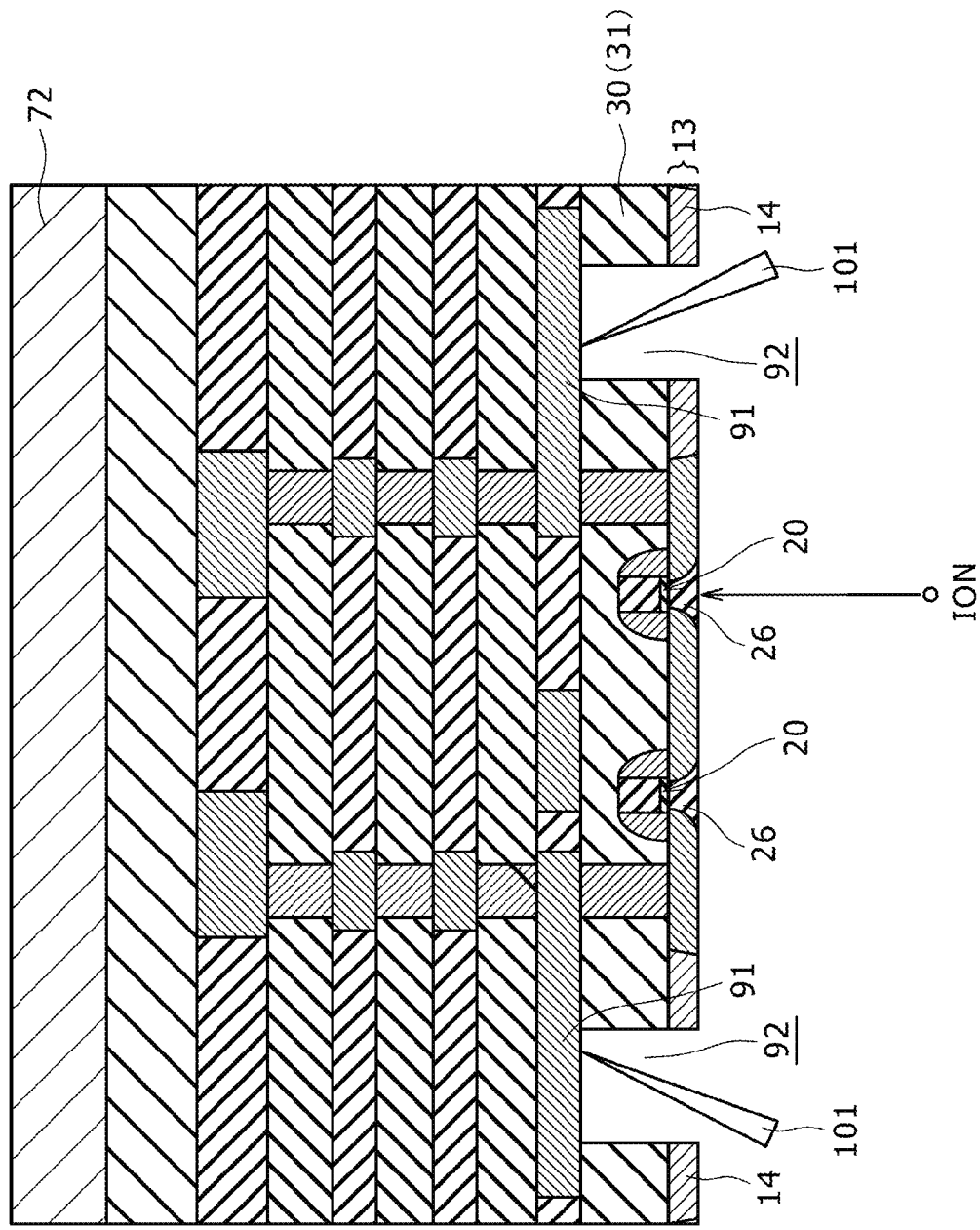
FIG. 6 is a manufacturing process sectional view of the first example of the method of manufacturing the semiconductor device according to an embodiment of the present invention.

A second example of a method of manufacturing a semiconductor device according to a second embodiment of the present invention will be described with reference to manufacturing process sectional views of FIGS. 5 and 6. FIGS. 5 and 6 show N-channel transistors included in a logic circuit section and a memory circuit section as an example.

As shown in FIG. 5, an SOI substrate 10 formed by laminating a substrate 11, an insulating layer 12, and a silicon layer 13 is prepared. The substrate 11 is formed by for example a silicon substrate as a semiconductor substrate having conductivity, for example. The insulating layer 12 is formed by a silicon oxide film, for example.

First, an element isolation region 14 for isolating elements from each other is formed in the silicon layer 13. The element isolation region 14 is for example formed by making a groove in the silicon layer 13 and filling in the groove with an insulating film. The insulating film includes for example a silicon oxide (for example $SiO_2$) film, a silicon nitride (for example SiN) film, and a silicon oxynitride (for example SiON) film. That is, the element isolation region 14 is formed of a so-called STI (Shallow Trench Isolation) structure.

Next, a transistor 20 is formed on the surface side of the silicon layer 13.

First, a gate insulating film 21 is formed on the surface of the silicon layer 13. The gate insulating film 21 is formed by a so-called high dielectric constant (High-k) film such for example as a hafnium oxide (for example $HfO_2$), a hafnium silicide oxynitride, a zirconium oxide (for example $ZrO_2$), or a zirconium silicide oxynitride. Alternatively, the gate insulating film 21 is formed by a composite film of a thermally oxidized nitride film and the high dielectric constant film. The high dielectric constant film is for example formed by metal-organic chemical vapor deposition and an atomic layer deposition method. The thermally oxidized nitride film is formed by thermal oxidation, plasma oxidation, and a plasma nitridation method. Further, a gate electrode 22 is formed on the gate insulating film 21. This gate electrode 22 is formed by for example a titanium nitride, a tantalum carbide, tungsten, or polysilicon.

Next, side wall spacers 23 are formed on the side walls of the gate electrode 22.

Next, source-drain regions 24 and 25 are formed in the silicon layer 13 with the gate electrode 22, the side wall spacers 23, and the element isolation region 14 as a mask. At this time, an LDD (Lightly Doped Drain) layer (not shown) is formed in the silicon layer 13 before the side wall spacers 23 are formed, and thereafter the side wall spacers 23 are formed. Then, the source-drain regions 24 and 25 are formed. The source-drain regions 24 and 25 may thus have an LDD structure. Hence, the silicon layer 13 directly under the gate electrode 22 forms a channel section 26.

The transistor 20 is thus formed.

Next, a first insulating film 30 and a wiring section 40 including wiring electrically connected to the transistor 20 are formed on the SOI substrate 10. In the constitution shown in the drawing, wiring sections 41 to 44 of four layers (pieces of wiring 51 to 54 and plugs 61 to 64) and first insulating films 31 to 38 of eight layers are formed. The number of layers of the wiring section 40 is selected and determined as appropriate. Thus, the number of layers of the wiring section 40 can be five or more. Generally, the wiring section 40 is formed by laminating about seven layers.

At this time, the first insulating film 31 in the lowermost layer is of a thickness of a few hundred nm, for example, and formed in a state of completely covering the gate electrode 22. The surface of the first insulating film 31 is desirably planarized by chemical mechanical polishing (CMP), for example. In addition, the surface of the first insulating film 38 in the uppermost layer is planarized by chemical mechanical polishing (CMP), for example, to expose the wiring 54 in the uppermost layer.

The wiring section 40 is formed as follows.

For example, a connecting hole is formed in the first insulating film 31, and the connecting hole is filled in with a conductive material on the inner surface of the connecting hole with an adhesion layer and a barrier layer interposed between the inner surface of the connecting hole and the conductive material, whereby the plug 61 is formed. For example, titanium is used for the adhesion layer, a titanium nitride is used for the barrier layer, and tungsten is used for the conductive material. Alternatively, tantalum is used for the adhesion layer, a tantalum nitride is used for the barrier layer, and copper is used for the conductive material. Incidentally, excesses of the adhesion layer, the barrier layer, and the conductive material formed on the first insulating film 31 are removed by chemical mechanical polishing, for example.

Next, the first insulating film 32 of the second layer is formed by for example a silicon carbide nitride on the first insulating film 31. A wiring groove is formed in the first insulating film 32 of the second layer, and for example the wiring groove is filled in with a conductive material on the inner surface of the wiring groove with an adhesion layer and a barrier layer interposed between the inner surface of the wiring groove and the conductive material, whereby wiring 51 connected to the plug 61 is formed. At the same time as the wiring 51, a probing electrode 91 connected to the transistor to be formed, for example the source-drain regions 24 and 25 is formed. Though not shown, a probing electrode connected to the gate electrode 22 is also formed.

Titanium or tantalum, for example, is used for the adhesion layer, a titanium nitride or a tantalum nitride, for example, is used for the barrier layer, and copper, for example, is used for the conductive material.

Incidentally, excesses of the adhesion layer, the barrier layer, and the conductive material formed on the first insulating film 32 are removed by chemical mechanical polishing, for example.

Next, the first insulating film 33 of the third layer is formed on the first insulating film 32 of the second layer. The first insulating film 33 of the third layer is formed by for example a silicon oxide carbide including hydrogen (H) (SiOCH), a silicon oxide carbide (SiOC), or a porous silicon oxide carbide.

Then, as in the above, a connecting hole is formed in the first insulating film 33, and for example the connecting hole is filled in with a conductive material on the inner surface of the connecting hole with an adhesion layer and a barrier layer interposed between the inner surface of the connecting hole and the conductive material, whereby a plug 62 connected to the wiring 51 is formed. For example, titanium or tantalum is used for the adhesion layer, a titanium nitride or a tantalum nitride is used for the barrier layer, and copper is used for the conductive material.

Incidentally, excesses of the adhesion layer, the barrier layer, and the conductive material formed on the first insulating film 33 are removed by chemical mechanical polishing, for example.

Thereafter, as in the above, a connecting hole is formed in the first insulating film 30 of the (n−1)th layer and a plug is formed, and a wiring groove is formed in the first insulating film 30 of the nth layer and wiring is formed. In this case, n is a total number of layers of the first insulating film 30, and n=8 in FIG. 1.

The semiconductor device 2 is thus formed.

[Formation of Supporting Substrate]

Next, a supporting substrate 72 is formed on the surface of the first insulating film 30 (38) formed in the uppermost layer with a second insulating film 71 interposed between the supporting substrate 72 and the first insulating film 30. The second insulating film 71 is formed by a silicon oxide ($SiO_2$) film, for example. A silicon substrate, a resin substrate, or a glass substrate, for example, can be used as the supporting substrate 72.

Next, as shown in FIG. 6, at least a part of the substrate 11 (see FIG. 5 described above) and the insulating layer 12 (see FIG. 5 described above) on the back side of the SOI substrate 10 is removed to expose the back surface of the silicon layer 13. In this case, the substrate 11 and the insulating layer 12 are removed over the entire surface.

Alternatively, the insulating layer 12 may be left as it is, or left thinly over the entire surface.

Alternatively, after the insulating layer 12 is removed completely, an oxide film, for example a silicon oxide film may be formed over the entire surface of the silicon layer 13.

Next, an opening 92 for exposing the probing electrode 91 is formed in the silicon layer 13 (element isolation region 14) and the first insulating film 30 (31) from the back side of the silicon layer 13.

[Measurement of Threshold Voltage]

Next, in this state, a probe 101 for measuring threshold voltage is brought into contact with the probing electrode 91 to measure the threshold voltage of the transistor 20.

That is, a performance verification test is performed on the logic circuit section and the memory circuit section (SRAM section) through the probing electrode 91.

For example, as for the logic circuit section, a test pattern is generated through a BIST (Built In Self Test) circuit provided in the logic circuit section, and a circuit block or a transistor of low performance which circuit block or transistor limits the performance of the semiconductor device 2 is detected. In addition, also for the SRAM section, a butterfly curve of each SRAM cell (see FIG. 9) is measured through a BIST circuit provided within an LSI, an SRAM cell of a low SNM is detected, and a transistor causing the low SNM is identified.

Specifically, for example, the probe 101 for the measurement is brought into contact with the probing electrode 91 to measure the threshold voltage of the transistor 20. The measurement is desirably performed on all the transistors 20.

[Adjustment of Threshold Voltage]

Thereafter the threshold voltage of the transistor 20 outside a threshold voltage reference is adjusted on the basis of the measured threshold voltage. The adjustment of the threshold voltage is performed by the single ion implantation method or the laser light spot irradiation method described above, for example. In addition, annealing may be performed by laser light irradiation after the single ion implantation.

[Adjustment of Threshold Voltage by Ion Implantation]

The single ion implantation method is performed by ion implantation of a group 13 element or a group 15 element into the channel section 26 of the transistor 20 to be adjusted in threshold voltage from the back side of the silicon layer 13. While the group 13 element includes boron (B), aluminum (Al), gallium (Ga), indium (In) and the like, the group 13 element is more preferably boron (B). While the group 15 element includes nitrogen (N), phosphorus (P), arsenic (As), antimony (Sb) and the like, the group 15 element is more preferably phosphorus (P).

The threshold voltage of the transistor 20 is adjusted by ion implantation of the group 13 element into the channel section 26 of the transistor 20. For example, when the transistor 20 is an NFET, the threshold voltage (but the absolute value of the threshold voltage) is raised. When the transistor 20 is a PFET, the threshold voltage (but the absolute value of the threshold voltage) is lowered.

Thus, in the case of a FET having a high threshold voltage, adjustment is made so as to decrease the threshold voltage. In the case of a FET having too low a threshold voltage, adjustment is made so as to increase the threshold voltage.

[Annealing Process]

In addition, after the ion implantation, an annealing process may be performed by spot-like irradiation of the ion implanted region with laser light. In this case, for shallow absorption of the laser light on the irradiated surface side of the silicon layer 13, ultraviolet laser light, for example, is used as short wavelength laser light. For example, XeCl laser light (a wavelength of 308 nm), XeF laser light (a wavelength of 351 nm), KrF laser light (a wavelength of 248 nm) or the like can be used.

[Adjustment of Threshold Voltage by Laser Light Irradiation]

The process of adjusting the threshold voltage of the transistor 20 outside the threshold voltage reference is performed by spot-like irradiation of the channel section 26 of the transistor 20 with laser light from the back side of the silicon layer 13.

By irradiating the channel section 26 of the transistor 20 with laser light in a spot-like form, an impurity in the channel section 26 is activated, an impurity distribution is modulated, and thus the threshold voltage of the transistor 20 is adjusted. For example, in both cases where the transistor 20 is an NFET and where the transistor 20 is a PFET, the threshold voltage (but the absolute value of the threshold voltage) is lowered.

It is generally difficult to identify a transistor that limits the performance of the logic circuit section among the large number of transistors forming the logic circuit section. It is, however, possible to identify a circuit block that limits the performance among circuit blocks (certain transistor groups) forming the logic circuit section. Accordingly, also in the second manufacturing method, the threshold voltage of transistors in each circuit block is adjusted, whereby the performance of the semiconductor device as a whole can be improved.

After the threshold voltage is adjusted, the measuring probe 101 is brought into contact with the wiring 54 of the uppermost layer again to measure the threshold voltage of the transistor 20 and verify the performance of the transistor 20 or the circuit block. When the performance falls short of a standard, the above-described adjustment of the threshold voltage of the transistor is performed again.

In addition, with the second manufacturing method, the process of measuring the threshold voltage of the transistor and the process of adjusting the threshold voltage of the transistor can be performed in situ. For example, the threshold voltage is adjusted by the single ion implantation or the spot laser light irradiation while analytic evaluation of the performance of the transistor or the circuit block is performed by a measuring probe installed within an ion implantation device or a laser annealing device.

In addition, with the second manufacturing method, the opening 92 for probing is formed on the back surface of the silicon layer 13, and thereby the process of adjusting the threshold voltage of the transistor 20 from the back surface of the silicon layer 13 can be performed immediately after probing. That is, it is not necessary to go through the process of forming the supporting substrate 72 and the process of removing the substrate 11 and the insulating layer 12. Thus, the threshold voltage can be adjusted without variation being caused to a probing result, and therefore accurate adjustment can be performed.

Further, the second manufacturing method measures the threshold voltage of each individual transistor 20, and adjusts the threshold voltage of a transistor 20 outside the threshold voltage reference. Therefore variation in the threshold voltage of the transistor 20 is reduced.

Thus, reducing the variation in the threshold voltage provides advantages of higher speed, lower-voltage operation, and lower power consumption of the transistor circuit. That is, higher speed, lower-voltage operation, and reduced power consumption of the logic circuit section can be achieved. In addition, variation in SNM of the memory circuit section, for example an SRAM can be reduced, and improvement in yield and lower-voltage operation and lower power consumption of the SRAM can be achieved.

<3. Third Embodiment>

[First Example of Constitution of Semiconductor Device]

A first example of a semiconductor device according to the second embodiment of the present invention will be described with reference to a manufacturing process sectional view of FIG. 7.

Figure 7:
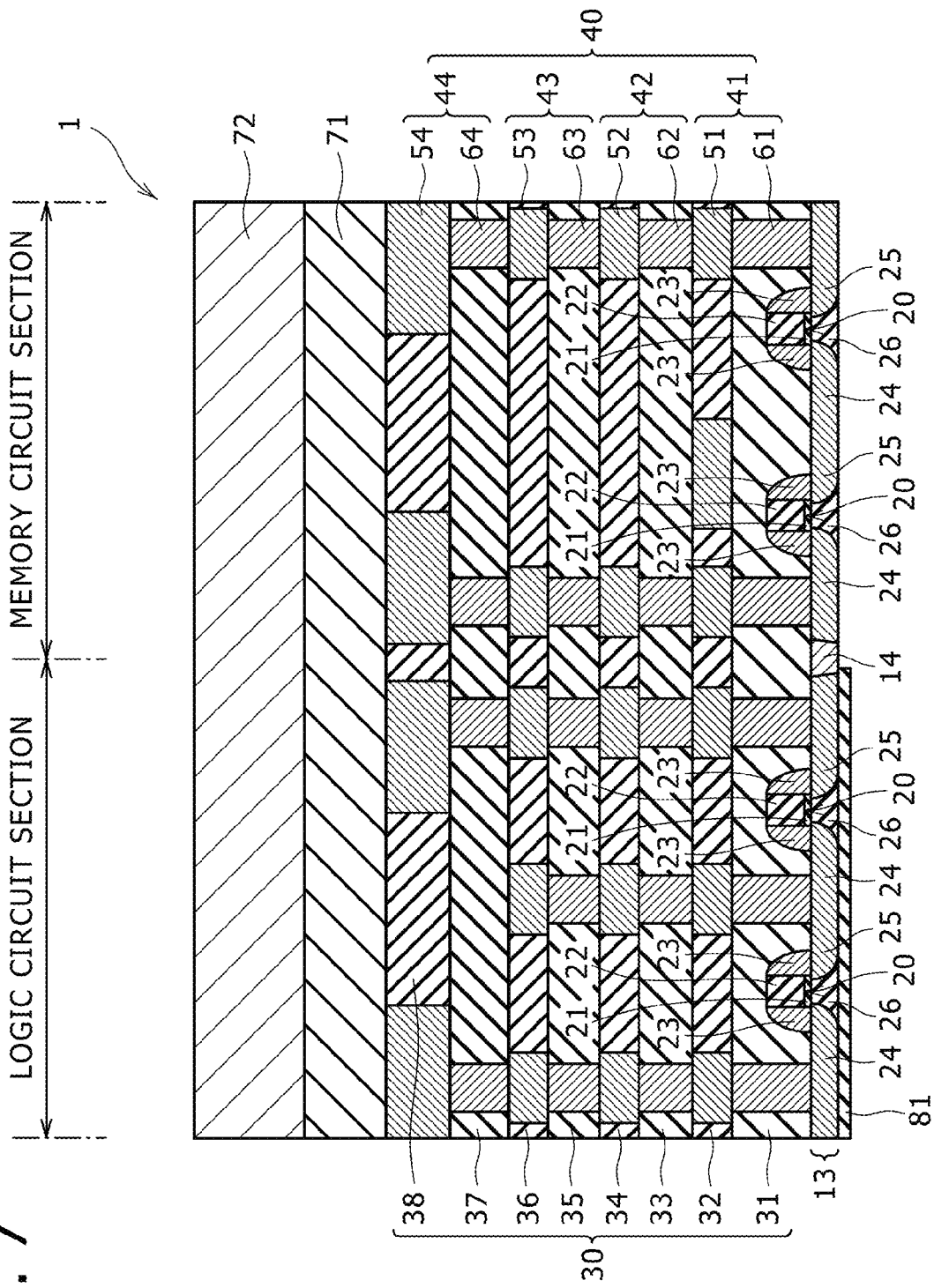
FIG. 7 is a schematic configuration sectional view of a first example of the semiconductor device according to an embodiment of the present invention.

As shown in FIG. 7, transistors 20 are formed on the surface side of a silicon layer 13 in a state of being isolated by an element isolation region 14. The element isolation region 14 is for example formed of an STI structure composed of for example a silicon oxide film, a silicon nitride film, or a silicon oxynitride film.

The transistor 20 is formed as follows.

A gate electrode 22 is formed on the surface of the silicon layer 13 with a gate insulating film 21 interposed between the gate electrode 22 and the silicon layer 13. The gate insulating film 21 is formed by a so-called high dielectric constant film of for example a hafnium oxide, a hafnium silicide oxynitride, a zirconium oxide, or a zirconium silicide oxynitride. Alternatively, the gate insulating film 21 is formed by a composite film of a thermally oxidized nitride film and the high dielectric constant film. The gate electrode 22 is formed by for example a titanium nitride, a tantalum carbide, tungsten, or polysilicon. In addition, side wall spacers 23 are formed on the side walls of the gate electrode 22.

Further, source-drain regions 24 and 25 are formed in the silicon layer 13 on both sides of the gate electrode 22. In FIG. 7, commonality of the source-drain regions 24 and 25 is provided between a part of the transistors 20. Though not shown in the figure, the source-drain regions 24 and 25 may have an LDD (Lightly Doped Drain) structure. The silicon layer 13 directly under the gate electrode 22 thus formed becomes a channel section 26.

The transistor 20 is formed as described above.

A first insulating film 30 covering the transistor 20 is formed on the surface of the silicon layer 13. In addition, a wiring section 40 electrically connected to the transistor 20 is formed in a plurality of layers in the first insulating film 30. In the constitution shown in the drawing, wiring sections 41 to 44 of four layers (pieces of wiring 51 to 54 and plugs 61 to 64) and first insulating films 31 to 38 of eight layers are formed. The number of layers of the wiring section 40 is selected and determined as appropriate. Thus, the number of layers of the wiring section 40 can be five or more. Generally, the wiring section 40 is formed by laminating about seven layers.

Further, a supporting substrate 72 is formed on the surface of the first insulating film 30 with a second insulating film 71 interposed between the supporting substrate 72 and the first insulating film 30. The second insulating film 71 is formed by a silicon oxide film, for example. A silicon substrate, a resin substrate, or a glass substrate, for example, can be used as the supporting substrate 72.

In addition, an adjusting insulating film 81 for adjusting the threshold voltage of the transistor 20 is formed on the back surface of the silicon layer 13.

The adjusting insulating film 81 is formed by a silicon oxide film including a group 13 element or a group 15 element.

While the group 13 element includes boron, aluminum, gallium, indium and the like, the group 13 element is more preferably boron. By forming the silicon oxide film including the group 13 element, when the transistor 20 is an NFET, the threshold voltage (but the absolute value of the threshold voltage) is raised, and when the transistor 20 is a PFET, the threshold voltage (but the absolute value of the threshold voltage) is lowered.

While the group 15 element includes nitrogen, phosphorus, arsenic, antimony and the like, the group 15 element is more preferably phosphorus. By forming the silicon oxide film including the group 15 element, when the transistor 20 is an NFET, the threshold voltage (but the absolute value of the threshold voltage) is lowered, and when the transistor 20 is a PFET, the threshold voltage (but the absolute value of the threshold voltage) is raised.

Thus, in the case of a FET having a high threshold voltage, adjustment can be made so as to decrease the threshold voltage. In the case of a FET having too low a threshold voltage, adjustment can be made so as to increase the threshold voltage.

The adjusting insulating film 81 is formed by an insulating film having stress, for example a silicon nitride film. That is, a stress inherent in the silicon nitride film is applied to the channel section 26 of the transistor 20, whereby the threshold voltage of the transistor 20 is adjusted.

For example, when the transistor 20 is a PFET, and the stress of the silicon nitride film is a compressive stress, the threshold voltage of the PFET can be lowered. When the transistor 20 is an NFET, and the stress of the silicon nitride film is a tensile stress, the threshold voltage of the NFET can be lowered.

The silicon nitride film can be made to be a compressive stress film by including carbon in the silicon nitride film, and made to be a tensile stress film by including hydrogen (H) in the silicon nitride film.

Thus, in the case of a FET having a high threshold voltage, adjustment can be made so as to decrease the threshold voltage. In the case of a FET having too low a threshold voltage, adjustment can be made so as to increase the threshold voltage.

The adjusting insulating film 81 is also formed by an insulating film having a fixed charge.

For example, as an insulating film having a fixed charge, an insulating film having a negative fixed charge or an insulating film having a positive fixed charge is used properly according to a purpose. The insulating film having the negative fixed charge includes a hafnium oxide ($HfO_2$) film. The insulating film having the positive fixed charge includes for example a silicon oxynitride (SiON) film.

In the case of the insulating film having the negative fixed charge, for example the negative fixed charge in the hafnium oxide film gives a charge (electron) to the channel section 26 of the transistor 20, whereby the threshold voltage of the transistor 20 is adjusted. For example, when the transistor 20 is an NFET, the threshold voltage (but the absolute value of the threshold voltage) is raised. When the transistor 20 is a PFET, the threshold voltage (but the absolute value of the threshold voltage) is lowered.

In the case of the insulating film having the positive fixed charge, for example the positive fixed charge in the silicon oxynitride film gives a charge (hole) to the channel section 26 of the transistor 20, whereby the threshold voltage of the transistor is adjusted. For example, when the transistor 20 is a PFET, the threshold voltage (but the absolute value of the threshold voltage) is raised. When the transistor 20 is an NFET, the threshold voltage (but the absolute value of the threshold voltage) is lowered.

Thus, in the case of a FET having a high threshold voltage, adjustment can be made so as to decrease the threshold voltage. In the case of a FET having too low a threshold voltage, adjustment can be made so as to increase the threshold voltage.

The semiconductor device 1 has the adjusting insulating film for adjusting the threshold voltage of the transistor on the back surface of the silicon layer 13, whereby the threshold voltage of the transistor is adjusted to a desired value. Thus, reducing variation in the threshold voltage provides advantages of higher speed, lower-voltage operation, and lower power consumption of the transistor circuit.

<4. Fourth Embodiment>
[Second Example of Constitution of Semiconductor Device]

A second example of a semiconductor device according to the second embodiment of the present invention will be described with reference to a manufacturing process sectional view of FIG. 8.

Figure 8:
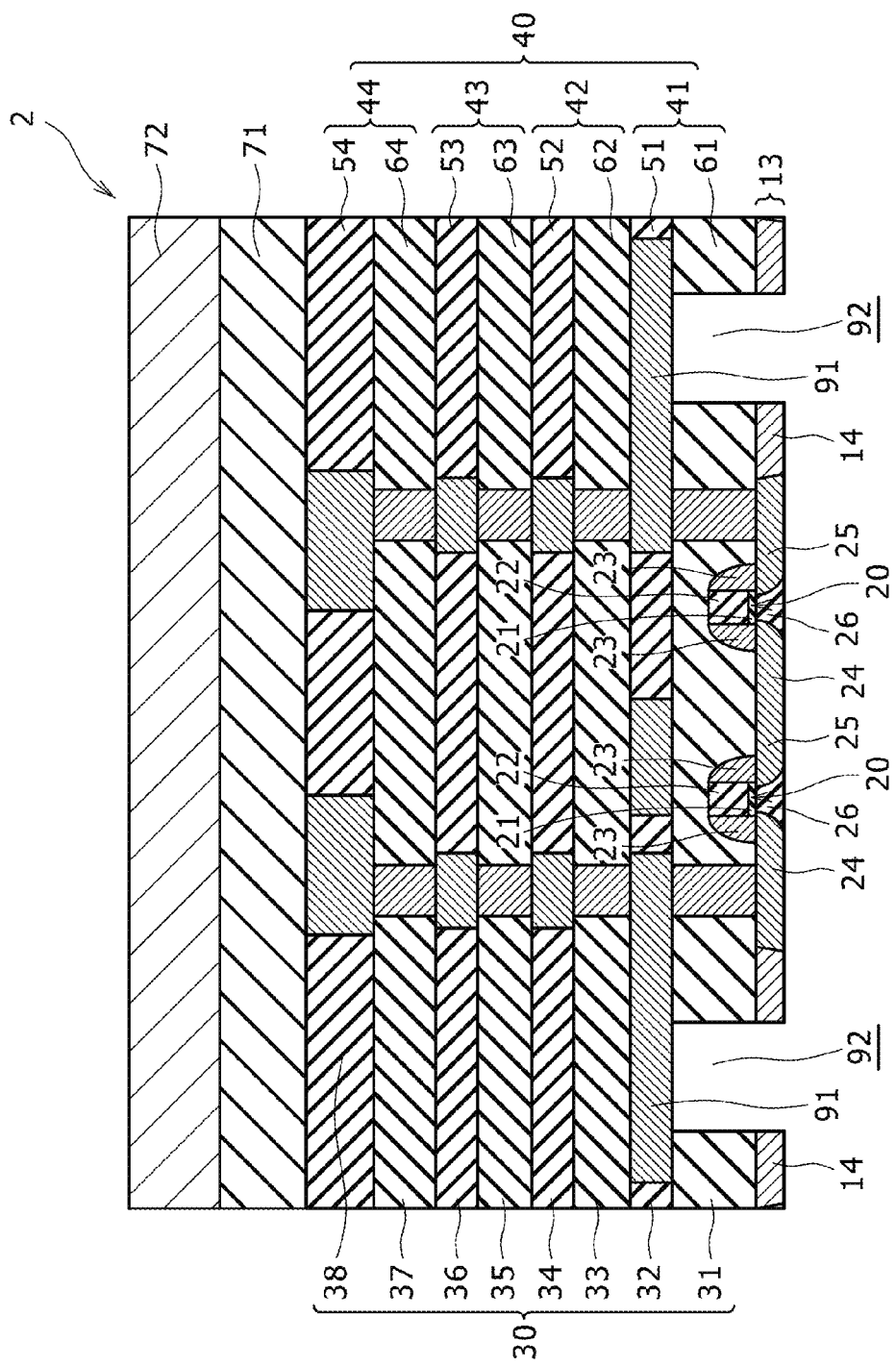
FIG. 8 is a schematic configuration sectional view of a second example of the semiconductor device according to an embodiment of the present invention.

As shown in FIG. 8, transistors 20 are formed on the surface side of a silicon layer 13 in a state of being isolated by an element isolation region 14. The element isolation region 14 is for example formed of an STI structure composed of for example a silicon oxide film, a silicon nitride film, or a silicon oxynitride film.

The transistor 20 is formed as follows.

A gate electrode 22 is formed on the surface of the silicon layer 13 with a gate insulating film 21 interposed between the gate electrode 22 and the silicon layer 13. The gate insulating film 21 is formed by a so-called high dielectric constant film of for example a hafnium oxide, a hafnium silicide oxynitride, a zirconium oxide, or a zirconium silicide oxynitride. Alternatively, the gate insulating film 21 is formed by a composite film of a thermally oxidized nitride film and the high dielectric constant film. The gate electrode 22 is formed by for example a titanium nitride, a tantalum carbide, tungsten, or polysilicon. In addition, side wall spacers 23 are formed on the side walls of the gate electrode 22.

Further, source-drain regions 24 and 25 are formed in the silicon layer 13 on both sides of the gate electrode 22. In FIG. 8, commonality of the source-drain regions 24 and 25 is provided between a part of the transistors 20. Though not shown in the figure, the source-drain regions 24 and 25 may have an LDD structure. The silicon layer 13 directly under the gate electrode 22 thus formed becomes a channel section 26.

The transistor 20 is formed as described above.

A first insulating film 30 covering the transistor 20 is formed on the surface of the silicon layer 13. In addition, a wiring section 40 electrically connected to the transistor 20 is formed in a plurality of layers in the first insulating film 30. In the constitution shown in the drawing, wiring sections 41 to 44 of four layers (pieces of wiring 51 to 54 and plugs 61 to 64) and first insulating films 31 to 38 of eight layers are formed. The number of layers of the wiring section 40 is selected and determined as appropriate. Thus, the number of layers of the wiring section 40 can be five or more. Generally, the wiring section 40 is formed by laminating about seven layers.

In addition, a probing electrode 91 connected to the transistor, for example the source-drain regions 24 and 25 is formed by extending the wiring 51. Though not shown in the figure, a probing electrode connected to the gate electrode 22 may also be formed.

Further, a supporting substrate 72 is formed on the surface of the first insulating film 30 with a second insulating film 71 interposed between the supporting substrate 72 and the first insulating film 30. The second insulating film 71 is formed by a silicon oxide film, for example. A silicon substrate, a resin substrate, or a glass substrate, for example, can be used as the supporting substrate 72.

In addition, an opening 92 for exposing the probing electrode 91 from the back surface of the silicon layer 13 is formed in the silicon layer 13 and the first insulating film 30 (31).

The semiconductor device 2 is thus formed.

The semiconductor device 2 has the opening 92 for exposing the probing electrode 91 connected to the transistor 20, whereby the threshold voltage of the transistor 20 can be measured easily from the opening 92. As a result, analytic evaluation of the transistor 20 can be performed, and a circuit block or a transistor causing a lack of speed of the logic circuit section or a lack of a voltage margin is detected. Then, the threshold voltage of the detected transistor can be corrected after completion of a wafer process or while the analytic evaluation is performed.

Thus, variation in the threshold voltage can be reduced, so that advantages of higher speed, lower-voltage operation, and lower power consumption of the semiconductor device are obtained.

Generally, a semiconductor device (for example an LSI) includes tens of millions of transistors, for example. A distribution of threshold voltages of these transistors for example has a certain breadth, and there may be a transistor whose threshold voltage is higher than a reference. Accordingly, the transistor whose threshold voltage is higher than the reference can be adjusted so as to have a threshold voltage within the reference by the present invention. Therefore, the threshold voltages of the transistors of the semiconductor device as a whole make a transition to lower threshold voltages, so that the performance of the semiconductor device can be improved.

The present application contains subject matter related to that disclosed in Japanese Priority Patent Application JP 2008-309660 filed in the Japan Patent Office on Dec. 4, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
a transistor formed on a first surface of a silicon layer;
a first insulating film formed on said first surface of said silicon layer and covering said transistor;
a wiring section formed in said first insulating film and electrically connected to said transistor;
a supporting substrate formed on a surface of said first insulating film with a second insulating film interposed between the supporting substrate and the first insulating film; and
an adjusting insulating film for adjusting a threshold voltage of said transistor, the adjusting insulating film being formed on a second surface of said silicon layer opposing the first surface of said silicon layer, wherein said adjusting insulating film is formed by a silicon oxide film including one of a group 13 element and a group 15 element.

2. A semiconductor device comprising:
a transistor formed on a first surface of a silicon layer;
a first insulating film formed on said first surface of said silicon layer and covering said transistor;
a wiring section formed in said first insulating film and electrically connected to said transistor;
a supporting substrate formed on a surface of said first insulating film with a second insulating film interposed between the supporting substrate and the first insulating film; and
an adjusting insulating film for adjusting a threshold voltage of said transistor, the adjusting insulating film being formed on a second surface of said silicon layer opposing the first surface of said silicon layer, wherein said adjusting insulating film is formed by an insulating film having a fixed charge.

* * * * *